(12) United States Patent
Tihanyi

(10) Patent No.: US 7,301,204 B2
(45) Date of Patent: Nov. 27, 2007

(54) SOI COMPONENT WITH INCREASED DIELECTRIC STRENGTH AND IMPROVED HEAT DISSIPATION

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/943,491

(22) Filed: Sep. 17, 2004

(65) Prior Publication Data
US 2005/0093062 A1 May 5, 2005

(30) Foreign Application Priority Data
Sep. 19, 2003 (DE) ................ 103 43 503

(51) Int. Cl.
*H01L 29/72* (2006.01)
(52) U.S. Cl. ............. 257/347; 257/341; 257/355; 257/401
(58) Field of Classification Search ........ 257/347, 257/341, 355, 401
See application file for complete search history.

(56) References Cited

U.S. PATENT DOCUMENTS 6,121,661 A * 9/2000 Assaderaghi et al. ....... 257/355
6,297,534 B1 10/2001 Kawaguchi et al.
6,873,012 B2 * 3/2005 Stecher et al. ............. 257/347
2002/0113275 A1 8/2002 Stecher et al.
2004/0214410 A1 * 10/2004 Fricke et al. ............... 438/467

\* cited by examiner

*Primary Examiner*—Edward Wojciechowicz
(74) *Attorney, Agent, or Firm*—Maginot, Moore & Beck

(57) ABSTRACT

A semiconductor component arrangement comprises a semiconductor substrate of a first conduction type, an insulation layer arranged on the substrate, and a semiconductor layer arranged on the insulation layer. A semiconductor component is formed in said semiconductor layer. The semiconductor component includes a first semiconductor zone of a first conduction type, a second semiconductor zone of a second conduction type adjoining the first semiconductor zone, and a third semiconductor zone which is doped more heavily than the second semiconductor zone and positioned at a distance from the first semiconductor zone. The semiconductor zone further comprises a fourth semiconductor zone of the second conduction type. The fourth semiconductor zone has a first section formed in the second semiconductor zone and a second section formed in the underlying substrate. The first section and the second section of the fourth semiconductor zone are electrically conductively connected to one another through the insulation layer.

15 Claims, 7 Drawing Sheets

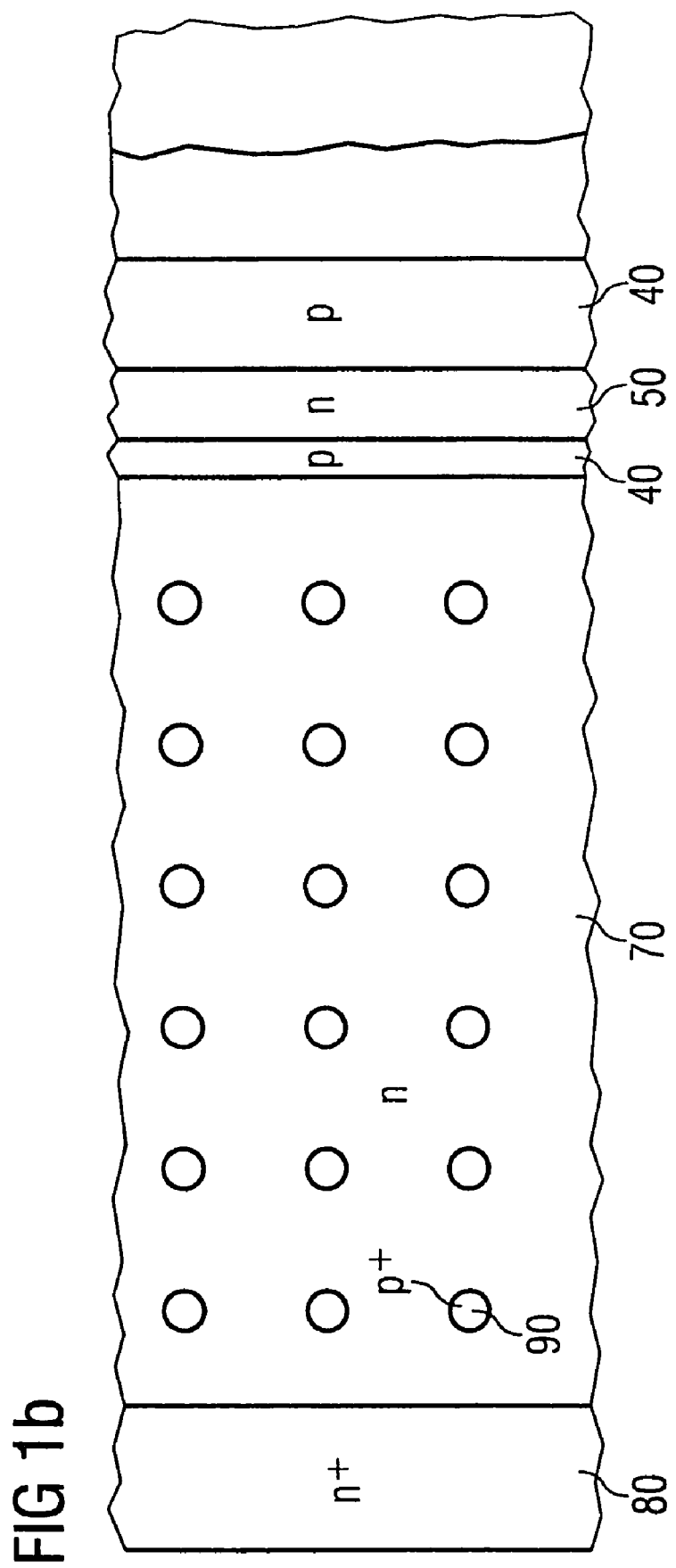

SOI COMPONENT WITH INCREASED DIELECTRIC STRENGTH AND IMPROVED HEAT DISSIPATION

BACKGROUND

The present invention relates to a semiconductor component arrangements and particularly silicon-on-insulator semiconductor wafers. Semiconductor component arrangements of this type, which are also referred to as SOI components irrespective of the semiconductor material used for the semiconductor layer, are generally known.

In the case of these components, the thickness of the insulation layer arranged between the semiconductor substrate and the semiconductor layer is dimensioned such that, in the case of the maximum potential differences that occur between the substrate, which is usually at a fixed potential, and the potentials occurring in the semiconductor layer, a sufficient dielectric strength is ensured and a voltage breakdown of the insulation layer is prevented. In the case of power components having a dielectric strength in the region of a few kV, the insulation layer must be designed with appropriate thickness. What is disadvantageous in this case, besides the higher production costs, is that the thermal resistance of the insulation layer increases as the thickness increases, thereby impairing the heat dissipation from the semiconductor layer to the semiconductor substrate situated beneath the insulation layer.

In order to improve the heat dissipation from a semiconductor layer which is formed on an insulation layer above a semiconductor substrate and in which symmetrically constructed lateral MOSFETs are formed, it is known from U.S. Pat. No. 6,121,661 to connect the source and drain zones of the MOSFETs to the substrate via heavily doped semiconductor zones through the insulation layer. Said semiconductor zones are of the same conduction type as the source and drain zones and doped complementarily to the substrate. The MOSFETs described in the aforementioned document are logic components, which can be discerned from the absence of a drift zone, and are thus designed for correspondingly low dielectric strengths.

DE 101 06 073 A1 describes the realization of a power component in a semiconductor layer on a thin insulation layer that is suitable for logic components, provision being made, for the purpose of reducing the voltage loading on the insulation layer, for lengthening the terminal zone of the component which has the highest potential with respect to the substrate through the insulation layer right into the complementarily doped substrate.

SUMMARY

It is an aim of the present invention to provide a semiconductor component arrangement, and particularly an SOI component, in which the voltage loading of the insulation layer is reduced and in which, moreover, an improved heat dissipation from the semiconductor layer into the substrate is ensured.

The semiconductor component arrangement comprises a semiconductor substrate of a first conduction type, an insulation layer arranged on the substrate, and also a semiconductor layer arranged on the insulation layer.

There is formed in said semiconductor layer a lateral semiconductor component with at least a first semiconductor zone of a first conduction type, a second semiconductor zone of a second conduction type, which adjoins the first semiconductor zone, and with a third semiconductor zone, which is doped more heavily than the second semiconductor zone, at a distance from the first semiconductor zone.

The first and second semiconductor zones form a pn junction, preceding from which, upon application of a voltage that reverse-biases the pn junction, a space charge zone forms in the second semiconductor zone, which is doped more weakly than the first semiconductor zone and the doping and dimensions of which determine the dielectric strength of the component. Said second semiconductor zone forms the drift zone of the component in the case of a component formed as a MOSFET, and a base zone of the component in the case of a diode or an IGBT.

In order to improve the heat dissipation from the semiconductor layer and in order to reduce the voltage loading on the insulation layer, provision is made of at least one fourth semiconductor zone of the second conduction type, which has a first section formed in the second semiconductor zone and a second section formed in the underlying substrate, which sections are electrically conductively connected to one another through the insulation layer.

Preferably, a multiplicity of such fourth semiconductor zones are provided at a distance from one another in the lateral direction of the semiconductor layer.

In this case, one embodiment provides for the fourth semiconductor zone to extend proceeding from a front side of the semiconductor layer that is remote from the insulation layer through the semiconductor layer and the insulation layer right into the semiconductor substrate. In this case, the first and second sections are each part of a contiguous semiconductor area that extends through the insulation layer right into the substrate and is doped complementarily to the second semiconductor zone. Preferably, the fourth semiconductor zones are formed in pillar-type fashion in this case.

A further embodiment provides for the first section and the second section of the fourth semiconductor zone to be arranged in a manner isolated from one another by the insulation layer, an electrically conductive connecting material, for example a metal or a metal-semiconductor compound, such as e.g. a silicide, extending through the insulation layer from the first section to the second section.

Depending on the concrete doping of the semiconductor zones, the semiconductor substrate is put at the highest or lowest potential that occurs during operation in the component arrangement, in order always to reverse-bias the substrate and the fourth semiconductor zones, and thereby to avoid shunt currents from the semiconductor layer into the substrate.

The fourth semiconductor zones, if appropriate in conjunction with the conductive connecting material, ensure a good removal of heat from the semiconductor layer into the semiconductor substrate having a substantially greater volume. Moreover, said fourth semiconductor zones bring about a reduction of the voltage loading on the insulation layer. If, upon application of a reverse voltage that reverse-biases the pn junction between the first and second semiconductor zones, a space charge zone propagates in the second semiconductor zone in the direction of the third semiconductor zone, then the fourth semiconductor zones in each case assume the potential of the space charge zone upon reaching the respective fourth semiconductor zone. In this case, the fourth semiconductor zones are doped so highly in comparison with the second semiconductor zone that they are never completely depleted of free charge carriers. Via the fourth semiconductor zones, the substrate situated beneath the insulation layer is thus put in each case at the local potential of the second semiconductor zone in the region of the respective fourth semiconductor zone, thereby significantly reducing a voltage loading on the insulation layer.

The component formed in the semiconductor layer may be formed as any desired power component having a pn junction.

Thus, the component may be formed as a diode, the third semiconductor zone then being of the same conduction type as the second semiconductor zone.

In order to realize a MOS transistor, at least one fifth semiconductor zone is present, which is separated from the second semiconductor zone by the first semiconductor zone, and in which a drive electrode formed in a manner insulated from the semiconductor body is present adjacent to the first semiconductor zone. Said fifth semiconductor zone forms the source zone of the transistor, the body zone of which is formed by the first semiconductor zone, the drift zone of which is formed by the second semiconductor zone and the drain zone of which is formed by the third terminal zone.

The drain zone is of the same conduction type as the drift zone in the case of a MOSFET and doped complementarily to the drift zone in the case of an IGBT. In the case of an IGBT, the terms emitter zone, collector zone and base zone are also customary instead of the terms source zone, drain zone and drift zone.

Preferably, at least one further component region that is electrically insulated from the power semiconductor component is present, further semiconductor components being integrated in said component region. By way of example, drive and evaluation circuits for the power component may be integrated in said component region, said circuits being connected to the power component via a wiring plane arranged above the semiconductor layer.

The insulation of the further component region from the power component may be effected by means of a so-called junction isolation with a pn junction or by means of a trench reaching as far as the insulation layer.

BRIEF DESCRIPTION OF THE DRAWINGS

The present invention is explained in more detail below using exemplary embodiments with reference to figures.

In the figures, unless specified otherwise, identical reference symbols designate identical component regions and identical parts with the same meaning.

DESCRIPTION

Figure 1A:
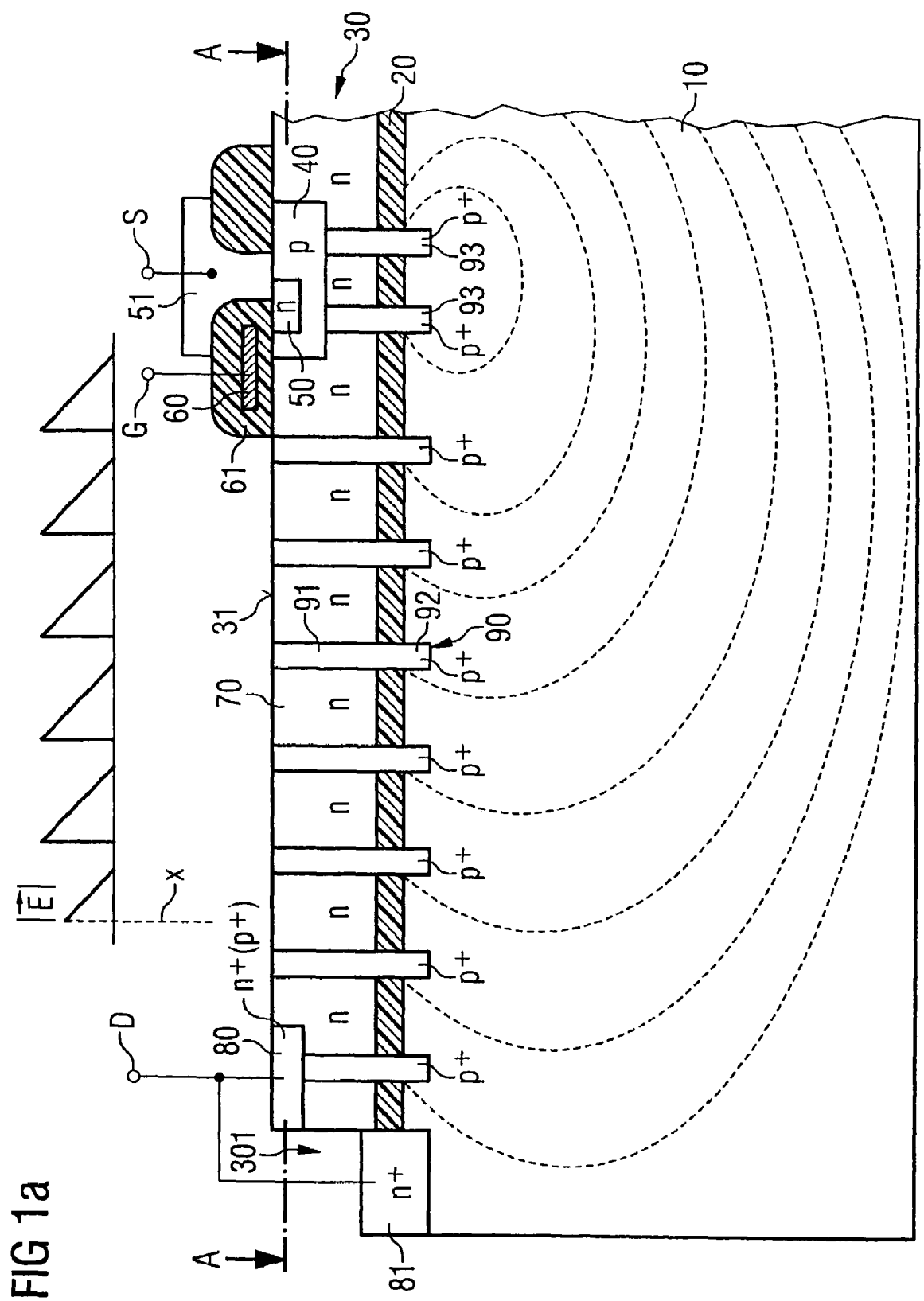
FIG. 1 shows an exemplary embodiment of a component arrangement according to the invention with a semiconductor component formed as a MOS transistor, which is arranged in a semiconductor layer on an insulator, in side view in cross section (FIG. 1a) and in plan view of a sectional plane A-A (FIG. 1b).

The component arrangement illustrated in FIGS. 1a and 1b comprises a n-doped semiconductor substrate 10, to which an insulation layer 20, for example a semiconductor oxide layer, is applied. A semiconductor layer 30 is applied to said insulation layer 20, a power component formed as a lateral MOSFET or lateral IGBT being integrated in said semiconductor layer in the case of the component arrangement in accordance with FIG. 1. For this purpose, a first semiconductor zone 40, which is doped complimentary to the basic doping, and forms the body zone of the MOSFET, is introduced into said semiconductor layer 30 proceeding from a front side 31 of the semiconductor layer 30 that is remote from the substrate. Said body zone 40 is adjoined in the lateral direction by a second semiconductor zone 70, the doping of which corresponds to the basic doping of the semiconductor layer 30 and which forms the drift zone of the MOSFET/IGBT. Arranged at a distance from the body zone 40 in the lateral direction is a third semiconductor zone 80, which is doped more heavily than the drift zone 70 and forms the drain zone of the component. The third semiconductor zone is of the same conduction type as the drift zone in the case of a MOSFET and doped complimentary to the drift zone in the case of an IGBT.

A plurality of fourth semiconductor zones 90 that are arranged at a distance from one another in the lateral direction and are doped complementarily to the drift zone 70 are present in the drift zone 70, the construction and functioning of which semiconductor zones will be explained below.

The source zone of the MOSFET/IGBT is formed by a fifth semiconductor zone 50, which is embedded in the body zone 40 in the exemplary embodiment. Contact is made with the body zone 40 and the source zone 50 jointly by a source electrode 51. In addition, a gate electrode 60 is present adjacent to the body zone 40 and in a manner insulated from the semiconductor layer 30 by an insulation layer 61.

In the case of an n-conducting MOSFET, the source zone 50, the drift zone 70 and the drain zone 80 are n-doped, and the body zone is p-doped. These dopings are complementary in the case of a p-conducting MOSFET.

In the exemplary embodiments illustrated, the fourth semiconductor zones 90 are formed in pillar-type fashion and extend proceeding from the front side 31 of the semiconductor layer 30 through the semiconductor layer 30 and the insulation layer 20 right into the semiconductor substrate 10. Said semiconductor zones 90 thus in each case comprise a first section 91 in the semiconductor layer 30 and a second section 92 in the semiconductor substrate 10, said sections 91, 92 being connected to one another by p-doped semiconductor material in the cut-outs of the insulation layer 20.

Figure 6A:
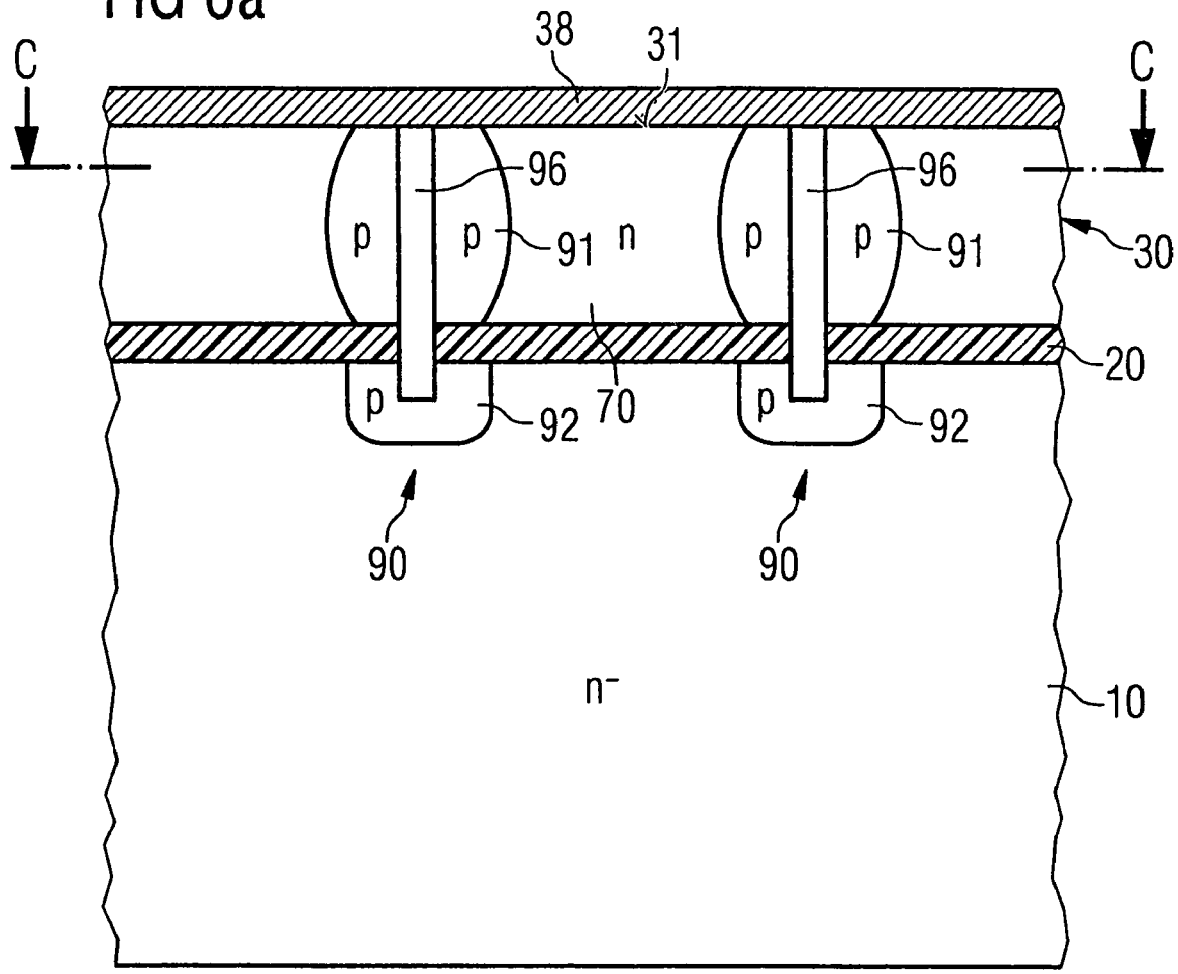
FIG. 6 illustrates an alternative possibility for the thermally conductive coupling of the semiconductor layer and the semiconductor substrate.
Figure 6A:
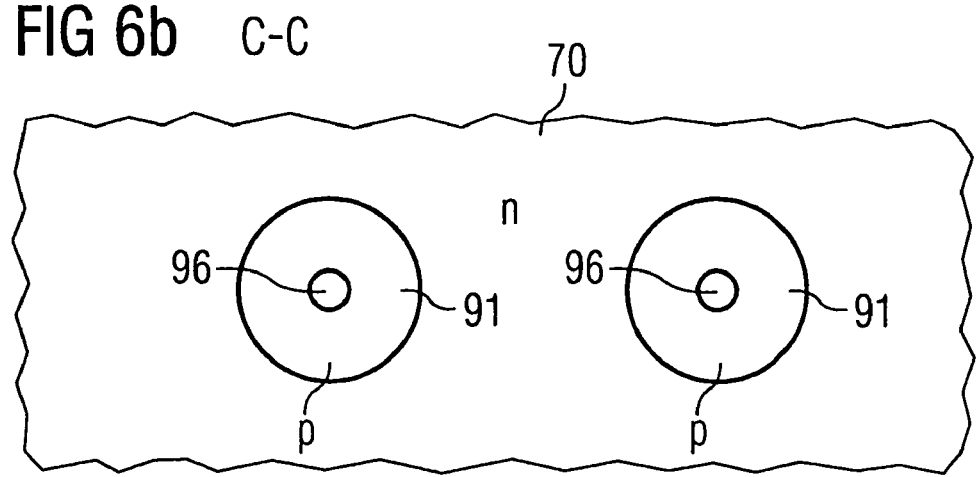

As an alternative to the homogeneous construction of said fourth semiconductor zone 90 as illustrated in FIG. 1 it is possible, with reference to FIG. 6, to provide mutually separate first and second sections 91, 92 in the semiconductor layer 30 and the semiconductor substrate 10, and to connect these two sections 91, 92 to one another by means of an electrically conductive connection 96. For this purpose, said conductive connection 96 comprises for example a metal or a metal-semiconductor compound. When using silicon as semiconductor component, said connection is a silicide, such as, for example, tantalum or tungsten silicide.

The task of the fourth semiconductor zones 90, independently of the construction thereof, is to ensure a good removal of heat from the semiconductor layer 30 into the semiconductor substrate 10. In order, in the process, to avoid a shunt current from the semiconductor layer 30 into the semiconductor substrate 10, the semiconductor substrate 10 is at the highest potential that occurs in the component arrangement. In the case of the n-conducting MOSFET illustrated in FIG. 1, this highest potential is usually present at the drain terminal 80, D, while the source terminal 51, S is usually at a lower potential or reference-ground potential. For the application of the highest potential, the semiconductor substrate 10 is connected to the drain terminal D in the example illustrated. For this purpose, in the example illustrated, a trench 301 is formed in the semiconductor layer 30 proceeding from the front side 31, which trench reaches through the insulation layer 20 right into the semiconductor substrate 10. A heavily n-doped semiconductor layer 81 is applied at the bottom of said trench and is short-circuited with the drain zone 80, D, which is merely illustrated diagrammatically in FIG. 1*a*. In the example in accordance with FIG. 1*a*, the drain terminal 80 is arranged in the vicinity of an edge of the component, so that the cut-out 301 is delimited by the semiconductor layer 30 only on one side.

Connecting the semiconductor substrate 10 to the highest potential that occurs in the component arrangement ensures that the potential in the semiconductor layer 30 is always less than or equal to said potential, so that the pn junctions between the fourth semiconductor zones 90 and the semiconductor substrate 10 are always reverse-biased, thereby preventing a shunt current between the semiconductor layer 30 and the semiconductor substrate 10.

The fourth semiconductor zones 90 furthermore serve for reducing the voltage loading on the insulation layer 20 upon application of a reverse voltage, as is explained below:

If a positive voltage is present between the drain terminal D and the source terminal S, then the pn junction between the body zone 40 and the drift zone 70 is reverse-biased. If the gate electrode 60 is driven in the off-state in the case of this switching state, then a space charge zone propagates in the drift zone 70 proceeding from the pn junction as the reverse voltage increases, said zone advancing in the direction of the drain zone 80. If the space charge zone gradually reaches the fourth semiconductor zones 90 in this case, which are so heavily doped that they are not completely depleted, then said fourth semiconductor zones 90 are fixedly held at the potential of the space charge zone when it reaches the respective fourth semiconductor zone 90. By means of the fourth semiconductor zones 90 penetrating through the insulation layer 20, the semiconductor substrate 10 situated beneath the insulation layer 20 is put at a corresponding potential in the region of the second sections 92, so that the insulation layer 20 directly adjacent to the fourth semiconductor zones 90 is not subjected to any voltage loading. In order to assist understanding, the profile of the electric fields in the drift zone 70 between the fourth semiconductor zones 90 with a reverse voltage present is illustrated above the cross-sectional illustration in FIG. 1*a*, the illustration assuming that the space charge zone has advanced as far as a point X in the drift zone 40. The potential at the respective positions of the drift zone 70 corresponds to the integral of the field strength proceeding from the pn junction.

Since a gradient of the field strength profile is likewise present due to the fourth semiconductor zones 90 in the semiconductor substrate 10, only an insignificant voltage loading on the insulation layer 20 results even in the lateral direction at a distance from the fourth semiconductor zones 90.

Figure 2:
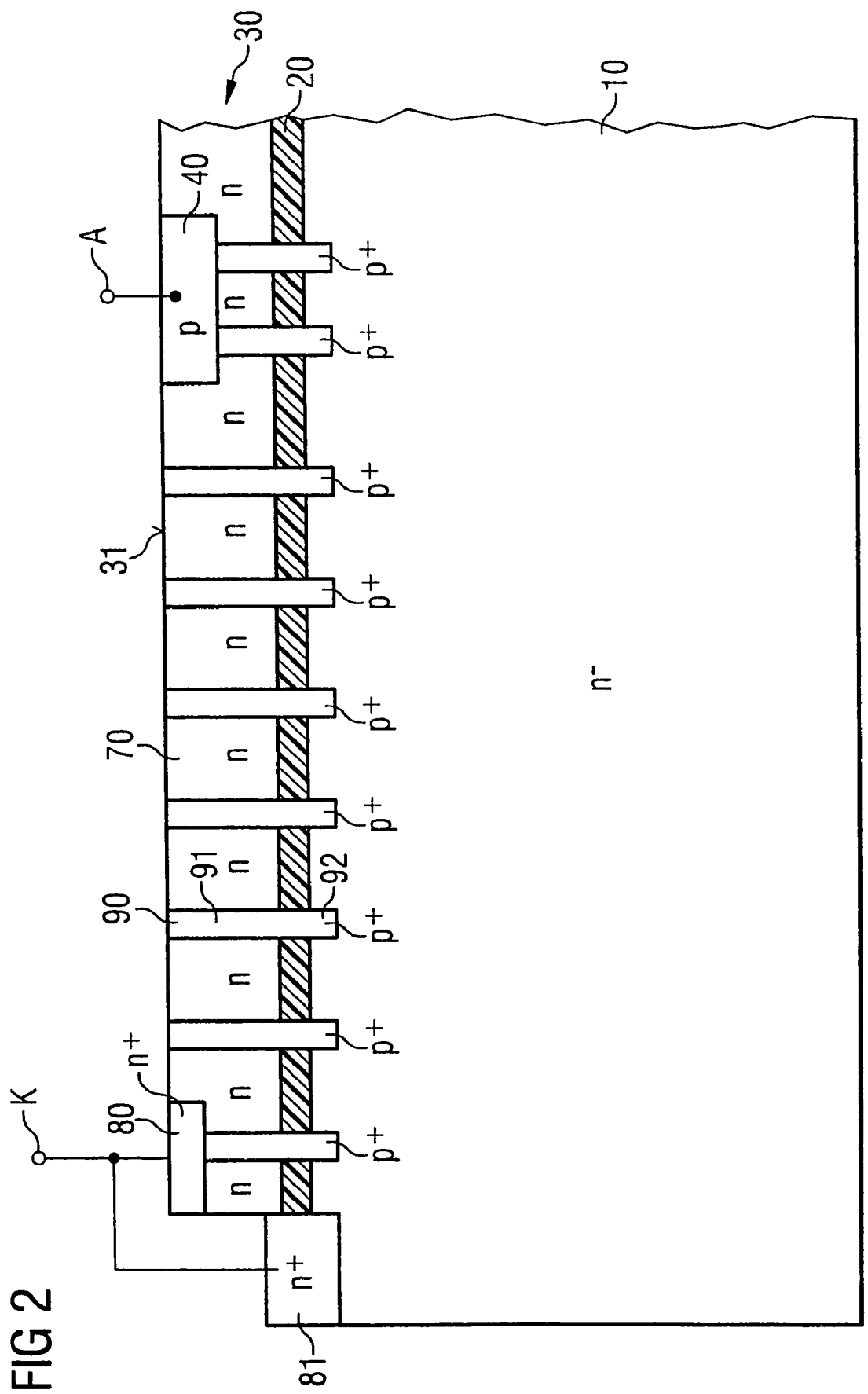
FIG. 2 shows an exemplary embodiment of a component arrangement according to the invention with a semiconductor component formed as a diode, in side view in cross section.

FIG. 2 shows a power component formed as a diode in the semiconductor layer 30, in side view in cross section. The construction of this diode component corresponds to the construction of the MOSFET explained with reference to FIG. 1, the p-doped first semiconductor zone 40 in this case forming the anode terminal of the diode and the heavily n-doped third semiconductor zone 80, arranged at a distance from the anode zone 40, forming the cathode zone. The pn junction turns off upon application of a positive voltage between the cathode 80, K and anode 40, A, the same situation as for the MOSFET explained in FIG. 1*a* resulting with regard to the field strength profile and the voltage loading.

Figure 3A:
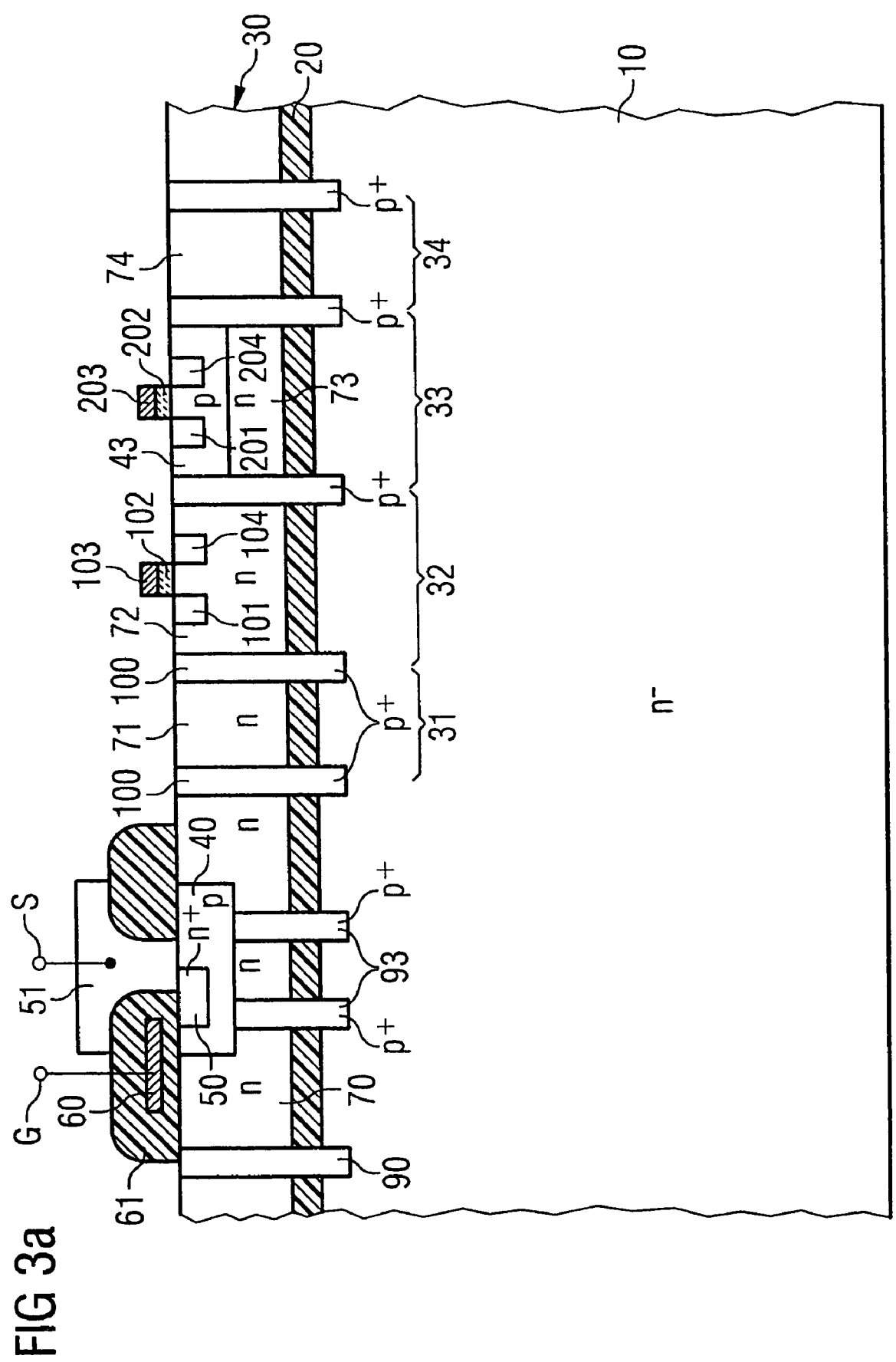
FIG. 3 shows a component arrangement according to the invention which has further component regions for integration of semiconductor components.
Figure 3B:
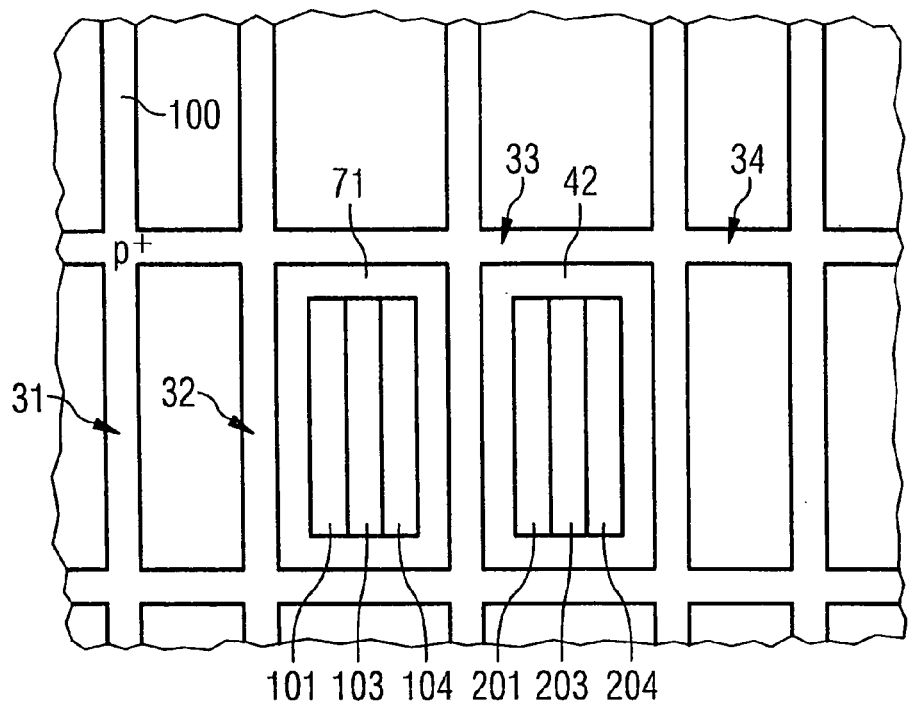

In an advantageous manner, besides the power component, further components in particular logic components, are integrated in the semiconductor layer 30 above the semiconductor substrate 10, and form by way of example a drive circuit for the power component integrated in the semiconductor layer 30, that is to say the MOSFET or IGBT in accordance with FIG. 1 or the diode in accordance with FIG. 2, this being illustrated in figure 3. FIG. 3*a* shows at a distance from the power component, which is formed as a MOSFET in the example, of which only the source and body zones 50, 40 thereof are illustrated, a plurality of component regions 31, 32, 33, 34 that are arranged next to one another and are in each case formed by sections 71, 72, 73, 74 of the semiconductor layer 30 and are separated from one another by a semiconductor structure 100, which is formed in lattice-like fashion in plan view (see FIG. 3*b*) and is doped complementarily to the semiconductor layer 30, said semiconductor structure being heavily p-doped in the example. In a manner corresponding to the fourth semiconductor zones 90, said lattice-like semiconductor structure 100 reaches through the insulation layer 20 right into the semiconductor substrate 10. Any desired semiconductor components can be integrated in the component regions surrounded by said semiconductor structure 100 and be connected to one another to form a circuit structure via a wiring plane (not specifically illustrated). By way of example, figure 3*a* shows a PMOS transistor integrated in the component region 32 and having p-doped source and drain zones 101, 104 and a gate electrode 103 arranged on the semiconductor layer 30, said gate electrode being insulated from the semiconductor layer 30 by an insulation layer 102. An NMOS transistor is formed in the adjacent component region 33. For this purpose, a p-doped well 43 is formed in the n-doped semiconductor section 73, n-doped source and drain zones 201, 204 being arranged at a distance from one another in said p-doped well. A gate electrode 203 is arranged above the semiconductor layer 30 in a manner insulated by an insulation layer 202. The lattice-like semiconductor structure 100 insulates the individual component regions 31, 32, 33, 34 from one another by pn junctions. Moreover, said semiconductor structure 100 also insulates all the component regions from the power component, arranged at a distance from said component regions 31, 32, 33, 34 in the lateral direction, by a pn junction.

The p-doped body zone 40 is advantageously connected to the substrate 10 by heavily p-doped semiconductor zones 93 that extend through the insulation layer 20 right into the semiconductor substrate 10 in a manner corresponding to the fourth semiconductor zone 90.

Figure 4:
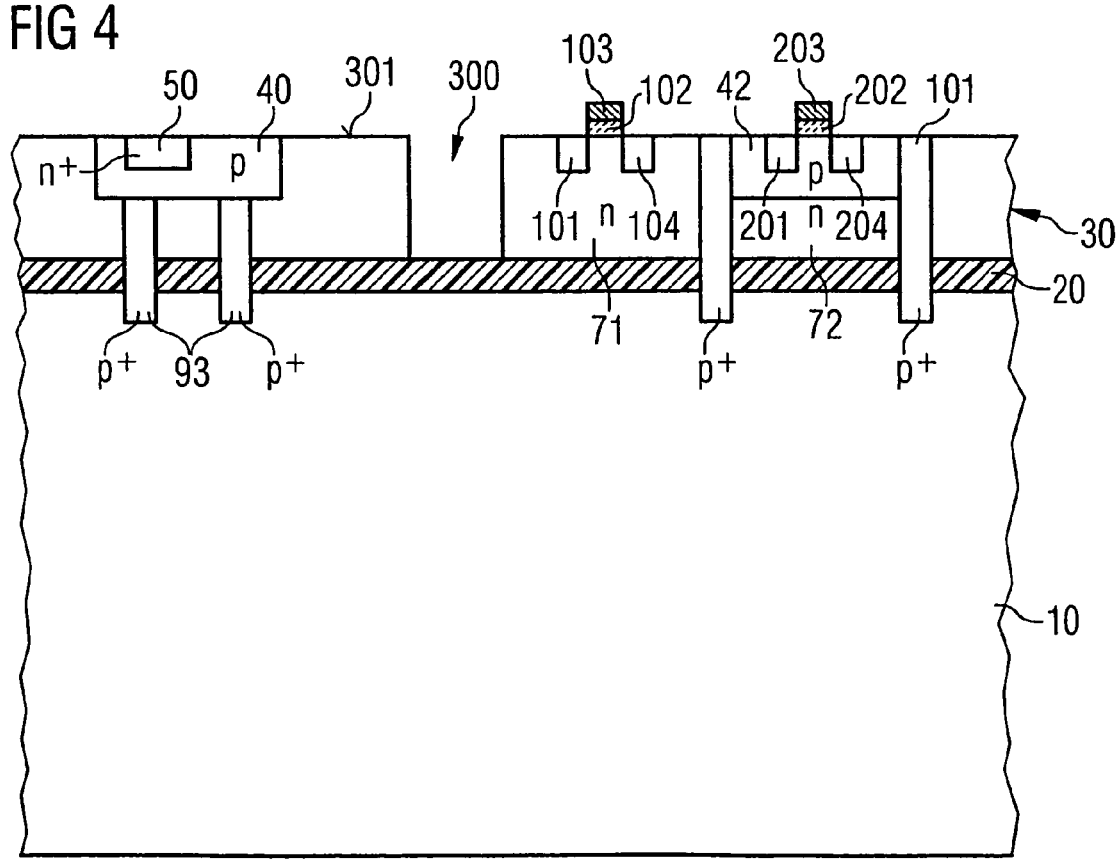
FIG. 4 shows a modification of the component arrangement illustrated in FIG. 3.

Instead of the component regions 31, 32, 33, 34 being insulated from the power component by pn junctions, it is also possible, with reference to FIG. 4, to insulate said component region from the power component by means of a trench 300 which, proceeding from the front side 31 of the semiconductor layer 30, extends as far as the insulation layer or through the latter.

Figure 5:
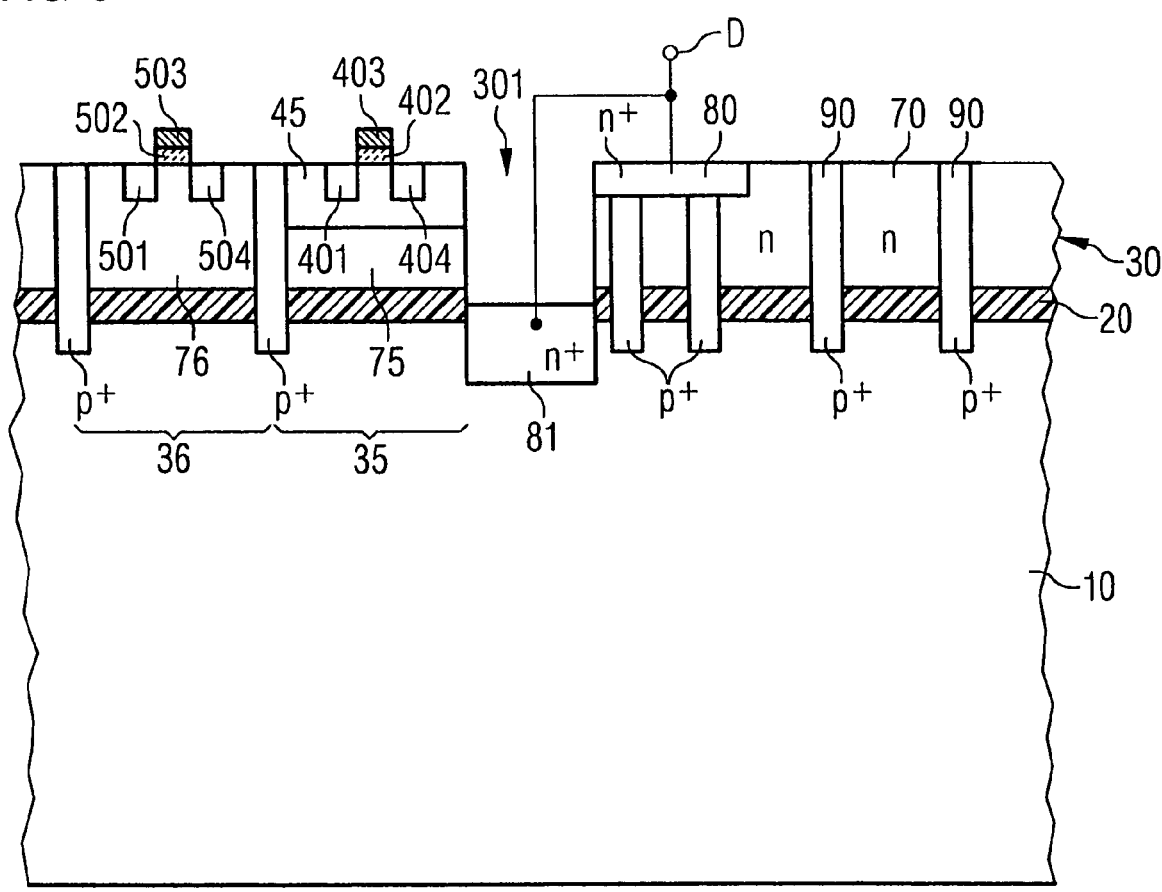
FIG. 5 shows an embodiment according to the invention of a component arrangement with further component regions for integration of semiconductor components.

In the case of the component in accordance with FIG. 1, the cut-out 301, via which the substrate 10 is connected to the drain terminal D or the cathode terminal K, is situated at the edge of the arrangement. FIG. 5 shows a modification of this component, the cut-out 301 being located at a distance from the edge of the arrangement in the case of the component in accordance with FIG. 5. The cut-out 301 illustrated in FIG. 5 simultaneously serves as insulation between the power component and further component regions 35, 36 in which further semiconductor components are integrated. By way of example, FIG. 5 shows a component region 35, in which an NMOS transistor having a source and drain zone 401, 404 is arranged in a p-doped well 45. The gate electrode 403 and the gate insulation 402 are situated above the semiconductor layer 30. A PMOS transistor having a source and a drain zone 501, 504 and also a gate electrode 503 on a gate insulation 502 is illustrated in a further component region 66 illustrated in FIG. 5.

The advantage of the component arrangement illustrated is that, on account of the fourth semiconductor zone 90 doped complementarily to the semiconductor substrate 10 and extending from active component regions right into the semiconductor substrate 10, the insulation layer 20 is subjected to virtually no voltage loading. This affords the possibility of also arranging power components on very thin insulation layers, for example on insulation layers which have hitherto only been used in connection with logic components. Moreover, the fourth semiconductor zones ensure a good removal of heat from the semiconductor layer.

The component arrangement can be applied to any desired power components with a drift path that takes up a reverse voltage, and is not restricted to the MOSFETs, IGBTs and diodes illustrated. In particular, the component arrangement is also suitable for integration of Schottky diodes or junction FETs. Suitable semiconductor materials are any desired semiconductor materials, besides silicon for example also gallium arsenide or gallium nitride.

LIST OF REFERENCE SYMBOLS

S Source terminal
D Drain terminal
A Anode terminal
K Cathode terminal
10 Semiconductor substrate
20 Insulation layer
30 Semiconductor layer
31 Front side of the semiconductor layer
31, 32, 33, 34 Component regions
40 First semiconductor zone, body zone, anode zone
43 p-doped semiconductor zone
45 p-doped semiconductor zone
50 fifth semiconductor zone, source zone
60 drive electrode, gate electrode
61 insulation layer, gate insulation
70 second semiconductor zone, drift zone
71, 72, 73, 74 sections of the semiconductor layer
75, 76 sections of the semiconductor layer
80 third semiconductor zone, drain zone
81 terminal zone
90 fourth semiconductor zone
91 first section of the fourth semiconductor zone
92 second section of the fourth semiconductor zone
93 heavily p-doped zones electrically conductive connecting zone
101, 104 p-doped semiconductor zones
102 insulation layer
103 drive electrode
201, 204 n-doped semiconductor zones
202 insulation layer
203 gate electrode
300 cut-out
301 cut-out
401, 404 n-doped semiconductor zones
402 insulation layer
403 gate electrode
501, 504 p-doped semiconductor zones
502 insulation layer
503 gate electrode

The invention claimed is:

1. A semiconductor component arrangement comprising:
a semiconductor substrate of a first conduction type;
an insulation layer arranged on the semiconductor substrate;
a semiconductor layer arranged on the insulation layer, wherein a semiconductor component is formed in the semiconductor layer, the semiconductor component including
(i) a first semiconductor zone of a second conduction type, (ii) a second semiconductor zone of the first conduction type, the second semiconductor zone adjoining the first semiconductor zone, and (iii) a third semiconductor zone doped more heavily than the second semiconductor zone, the third semiconductor zone removed from the first semiconductor zone by a distance; and
at least one fourth semiconductor zone of the second conduction type, the at least one fourth semiconductor zone having a first section formed in the second semiconductor zone and a second section formed in the underlying semiconductor substrate, wherein the first section and the second section are electrically conductively connected to one another through the insulation layer, and wherein the first section includes a cross-sectional area completely surrounded by the second semiconductor zone.

2. The semiconductor component arrangement as claimed in claim 1 wherein the at least one fourth semiconductor zone extends from a front side of the semiconductor layer that is remote from the insulation layer, through the semiconductor layer and the insulation layer, and into the semiconductor substrate.

3. The semiconductor component arrangement as claimed in claim 2 wherein the at least one fourth semiconductor zone is formed in pillar-type fashion.

4. The semiconductor component arrangement as claimed in claim 1 wherein the first section and the second section of the at least one fourth semiconductor zone are connected by means of an electrically conductive connecting material extending through the insulation layer.

5. The semiconductor component arrangement as claimed in claim 4 wherein the connecting material is a metal or a metal-semiconductor compound.

6. The semiconductor component arrangement as claimed in claim 1 wherein the at least one fourth semiconductor zone comprises a plurality of fourth semiconductor zones arranged in the second semiconductor zone in a manner spaced apart from one another in the lateral direction of the semiconductor layer.

7. The semiconductor component arrangement as claimed in claim 1 wherein the first semiconductor zone is embedded in the second semiconductor zone, and the at least one fourth semiconductor zone is formed below the first semiconductor zone.

8. The semiconductor component arrangement as claimed in claim 1 wherein the semiconductor component arrangement forms a diode, and wherein the third semiconductor zone is of the same conduction type as the second semiconductor zone.

9. The semiconductor component arrangement as claimed in claim 1 wherein the semiconductor component arrangement forms a transistor, the transistor further comprising at least one fifth semiconductor zone and a drive electrode, wherein the fifth semiconductor zone is separated from the second semiconductor zone by the first semiconductor zone, and wherein the drive electrode is adjacent to the first semiconductor zone and provided in a manner insulated from the semiconductor layer.

10. The semiconductor component arrangement as claimed in claim 9 wherein the semiconductor component arrangement forms a MOSFET, and wherein the third semiconductor zone is of the same conduction type as the second semiconductor zone.

11. The semiconductor component arrangement as claimed in claim 9, wherein the semiconductor component arrangement forms an IGBT, and wherein the third semiconductor zone is of a conduction type that is complementary to the conduction type of the second semiconductor zone.

12. The semiconductor component arrangement as claimed in claim 1 wherein the semiconductor component arrangement forms a semiconductor component and at least one further component region, the at least one further component region electrically insulated from the semiconductor component, further semiconductor components being integrated in said at least one further component region.

13. The semiconductor component arrangement as claimed in claim 12 wherein the at least one further component region is insulated from the semiconductor component by a pn junction.

14. The semiconductor component arrangement as claimed in claim 12 wherein the at least one further component region is insulated from the semiconductor component by a trench reaching as far as the insulation layer.

15. The semiconductor component arrangement as claimed in claim 1 wherein the third semiconductor zone is connected to the semiconductor substrate.

* * * * *